(12) United States Patent
Deboy et al.

(10) Patent No.: US 6,940,126 B2
(45) Date of Patent: Sep. 6, 2005

(54) FIELD-EFFECT-CONTROLLABLE SEMICONDUCTOR COMPONENT AND METHOD FOR PRODUCING THE SEMICONDUCTOR COMPONENT

(75) Inventors: Gerald Deboy, München (DE); Uwe Wahl, München (DE); Armin Willmeroth, Augsburg (DE)

(73) Assignee: Infineon Technologies AG, Munich (DE)

( * ) Notice: Subject to any disclaimer, the term of this patent is extended or adjusted under 35 U.S.C. 154(b) by 93 days.

(21) Appl. No.: 10/654,683

(22) Filed: Sep. 4, 2003

(65) Prior Publication Data

US 2005/0029581 A1 Feb. 10, 2005

(30) Foreign Application Priority Data

Sep. 4, 2002 (DE) .......................... 102 40 861

(51) Int. Cl.$^7$ ...................... H01L 29/76; H01L 21/336
(52) U.S. Cl. ...................... 257/332; 257/341; 257/492; 438/268; 438/274
(58) Field of Search ................................ 257/328–331, 257/341, 492, 493; 438/268, 273, 274

(56) References Cited

U.S. PATENT DOCUMENTS

| | | | |
|---|---|---|---|
| 4,754,310 A | | 6/1988 | Coe |
| 5,021,845 A | * | 6/1991 | Hashimoto .................. 257/331 |
| 5,216,275 A | | 6/1993 | Chen |
| 5,285,369 A | | 2/1994 | Balakrishnan |
| 5,438,215 A | | 8/1995 | Tihanyi |
| 5,930,630 A | * | 7/1999 | Hshieh et al. ............... 438/268 |
| 6,482,681 B1 | * | 11/2002 | Francis et al. .............. 438/138 |
| 6,664,590 B2 | * | 12/2003 | Deboy ......................... 257/328 |
| 6,686,625 B2 | * | 2/2004 | Tihanyi ....................... 257/331 |
| 6,803,629 B2 | * | 10/2004 | Tihanyi ....................... 257/342 |
| 6,846,706 B2 | * | 1/2005 | Spring et al. ............... 438/135 |
| 6,861,706 B2 | * | 3/2005 | Tihanyi ....................... 257/342 |
| 2003/0001548 A1 | | 1/2003 | Feldtkeller |

FOREIGN PATENT DOCUMENTS

| | | |
|---|---|---|
| DE | 43 09 764 A1 | 9/1994 |
| DE | 198 40 032 C1 | 11/1999 |
| DE | 100 01 394 A1 | 7/2001 |
| WO | 97/29518 | 8/1997 |

* cited by examiner

*Primary Examiner*—T. N. Quach
(74) *Attorney, Agent, or Firm*—Laurence A. Greenberg; Werner H. Stemer; Ralph E. Locher

(57) ABSTRACT

A semiconductor component has at least one first terminal zone of a first conductivity type in a semiconductor body. The first terminal zone is contact-connected by a first terminal electrode. A drift zone of the first conductivity type is adjoined by a second terminal zone of the second conductivity type. A channel zone of a second conductivity type is formed between the at least one first terminal zone and the drift zone. A control electrode is insulated from the semiconductor body and adjacent to the channel zone. A first channel is formed by the channel zone in a region adjacent to the control electrode, the first channel conducts only upon application of a control voltage that is not equal to zero between the control electrode and the first terminal zone. The first terminal electrode is connected to the drift zone via at least one second channel of the first conductivity type, which already conducts in the event of a control voltage equal to zero.

18 Claims, 16 Drawing Sheets

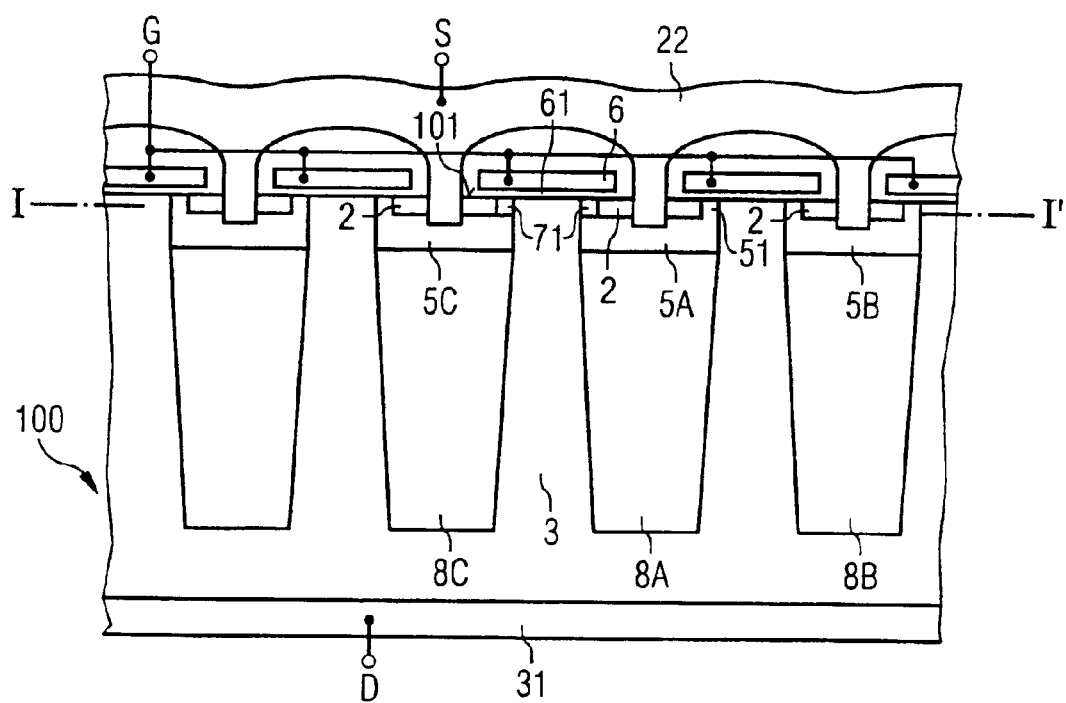

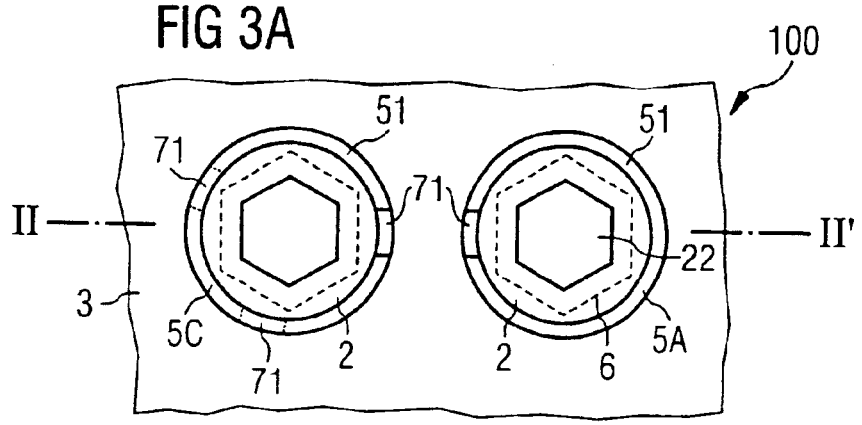
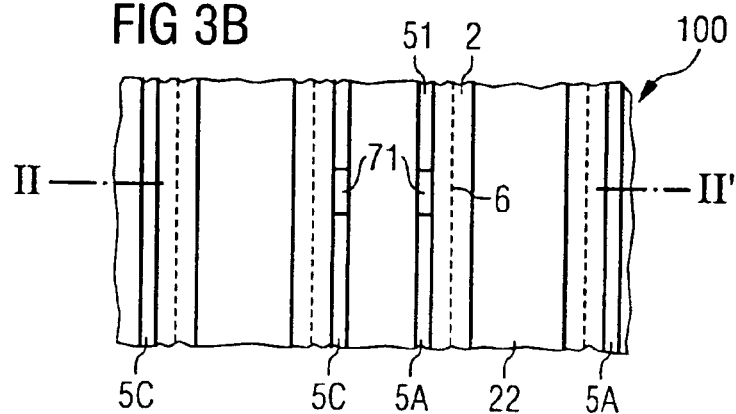
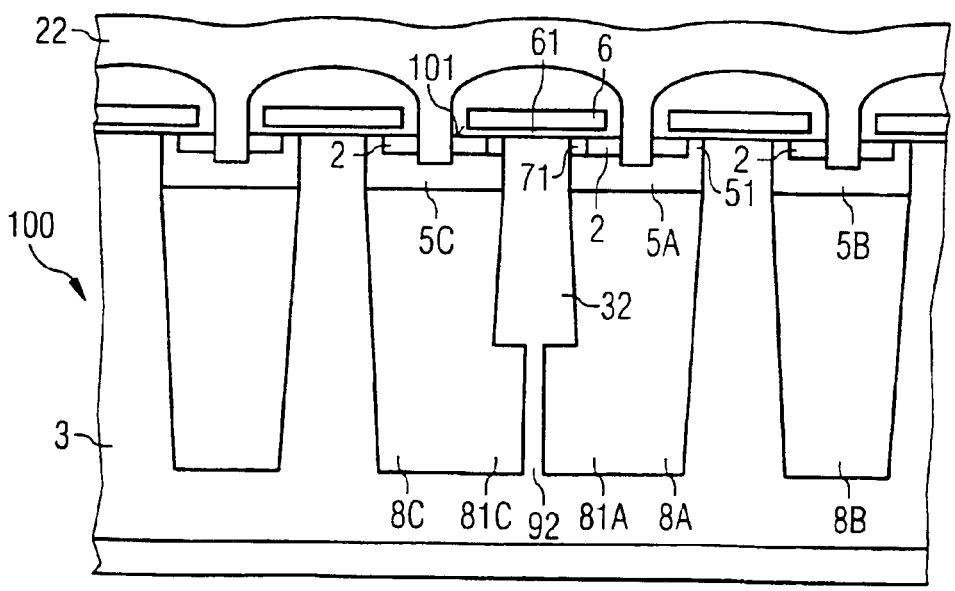

IV-IV

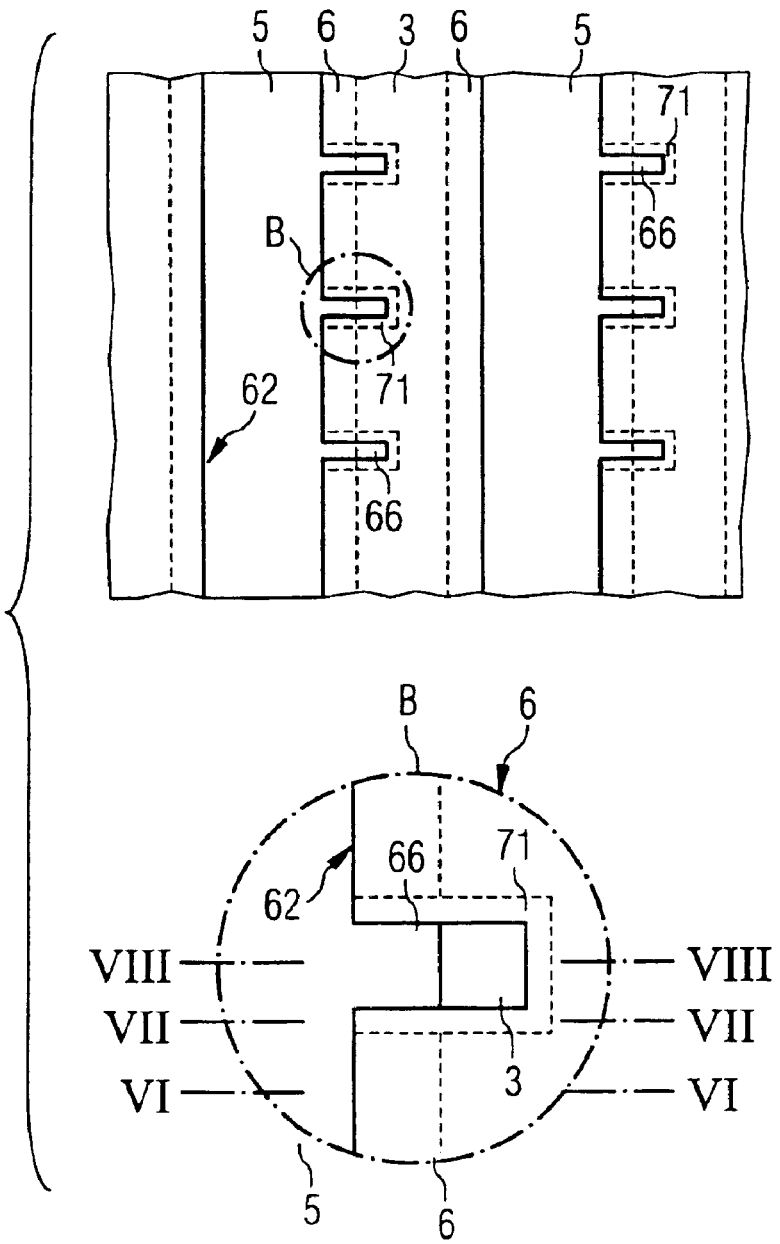

VI-VI

VII-VII

VIII-VIII

FIELD-EFFECT-CONTROLLABLE SEMICONDUCTOR COMPONENT AND METHOD FOR PRODUCING THE SEMICONDUCTOR COMPONENT

BACKGROUND OF THE INVENTION

Field of the Invention

The invention lies in the semiconductor technology field. More specifically, the invention relates to a semiconductor component, in particular a semiconductor switching element suitable for the voltage supply of a drive circuit in a switching converter.

German published patent application DE 100 01 394 A1 discloses a switched-mode power supply with a transformer having a primary coil and a secondary coil, in which a MOS transistor is connected in series with the primary coil and is turned on and off in pulsed fashion by a drive circuit. The voltage supply of the drive circuit is effected by means of a further MOSFET, whose load path is connected between the primary coil and a supply terminal of the drive circuit and which is driven by the drive circuit. In order to enable a first driving of the further MOSFET, a starting circuit is provided, which provides an initial voltage supply of the drive circuit after the switched-mode power supply has been switched on.

U.S. Pat. No. 5,285,369 discloses connecting a JFET (junction FET) and a power MOSFET in series with the primary coil of a transformer in a switched-mode power supply, a node that is common to the load paths of the MOSFET and of the JFET being connected via two further MOSFETs to a supply terminal of a drive circuit for the power MOSFET.

SUMMARY OF THE INVENTION

It is accordingly an object of the invention to provide a field-effect-controlled semiconductor component and an associated production method which overcome the above-mentioned disadvantages of the heretofore-known devices and methods of this general type and which provide for a component that is suitable for the voltage supply of a drive circuit in a switched-mode power supply and provides a supply current after the starting phase and/or a starting current during the starting phase, so that there is no need for an additional starting circuit. It is a further object of the invention to provide a method for producing such a component.

With the foregoing and other objects in view there is provided, in accordance with the invention, a semiconductor component, comprising:

at least one first terminal zone of a first conductivity type formed in a semiconductor body, and a first terminal electrode contact-connected to the first terminal zone;

a drift zone of the first conductivity type, and a second terminal zone of a second conductivity type adjoining the drift zone;

a channel zone of the second conductivity type disposed between the at least one first terminal zone and the drift zone, and a control electrode insulated from the semiconductor body and adjacent the channel zone;

the channel zone having a first channel in a region adjacent the control electrode, and the first channel conducting only upon application of a non-zero control voltage between the control electrode and the first terminal zone; and at least one second channel of the first conductivity type connecting the first terminal electrode to the drift zone, the at least one second channel already conducting when the control voltage equals zero.

In other words, the semiconductor component according to the invention comprises at least one first terminal zone of a first conductivity type in a semiconductor body, which is contact-connected by a first terminal electrode, a drift zone of the first conductivity type, which is adjoined by a second terminal zone of the second conductivity type, and also a channel zone of a second conductivity type, which is arranged between the at least one first terminal zone and the drift zone, and a control electrode arranged in a manner insulated from the semiconductor body and adjacent to the channel zone, a first channel which effects blocking in the voltage-free state of the semiconductor component being formed by the channel zone between the first terminal zone and the drift zone in a region adjacent to the control electrode. In addition, the first terminal electrode is connected to the drift zone via at least one second channel of the first conductivity type.

The semiconductor component according to the invention realizes a normally-off and a normally-on MOSFET which are integrated in a semiconductor body and which have a common first terminal electrode, a common drift zone and a common second terminal zone or an associated common second terminal electrode.

A semiconductor component of this type is suitable in particular for the voltage supply of a drive circuit in a switched-mode power supply, in which case, when the control electrode is not being driven, the first channel, which forms the channel of the normally off MOSFET effects blocking, while the second channel, which forms the channel of the normally on FET, conducts in order to supply a starting current for the drive circuit.

The component is preferably constructed from a multiplicity of cells, the second channels preferably being dimensioned such that the current flowing via said channels is significantly smaller—preferably smaller by more than a factor of 10—than the current which flows via the first channels when the control electrode is suitably driven.

The normally on FET may be formed as a depletion-mode MOSFET, as a JFET or as a combination of the two, and this can be achieved through the spatial arrangement and the precise configuration of the second channel in the semiconductor body.

In one embodiment it is provided that the first terminal zone is arranged below a front side of the semiconductor body, the control electrode is arranged in a manner insulated from the semiconductor body above the front side, and the second channel of the first conductivity type is formed between the front side and the channel zone below the control electrode. In this exemplary embodiment, the normally on FET is formed as a depletion-mode FET, in which case the second channel can be blocked by application of a suitable drive potential. In the case of an n-conducting FET, that is to say when the channel zone is p-doped and the first terminal zone, the drift zone and the second channel are n-doped, said drive potential is negative with respect to the potential of the second terminal zone.

In an embodiment in which the control electrode is formed above the semiconductor body, the first channel, which is formed by a section of the channel zone adjacent to the control electrode, is preferably present adjacent to the second channel below the control electrode. In this way, one channel zone can be utilized both for the normally off FET and for the normally on FET; a normally on and a normally off FET can be realized within one cell.

In an alternative embodiment, at least two channel zones are present, which are arranged in a manner insulated from the control electrode and adjacent thereto, a second channel of the first conductivity type being formed only between a first of these channel zones and the front side of the semiconductor body. This first channel zone is thus part of the normally on FET integrated in the semiconductor body. The second of these channel zones serves to realize the normally off FET and comprises no channel of the first conductivity type. This second channel zone completely isolates the first terminal zone and the drift zone, so that only a first channel formed by a section adjacent to the control electrode is present.

The doping concentration of the second channel required for realizing the normally on FET may correspond to the doping concentration of the drift zone or be greater or less than said doping concentration, depending on the cross section of said channel.

One embodiment of the invention provides for a depletion-mode FET and a JFET to be connected in series in order to realize the normally on FET. This is achieved in that a further channel of the first conductivity type is present between the second channel and the drift zone, said further channel being controlled by the potential at the channel zone. This channel is preferably formed between two channel zones of the second conductivity type, and thus bounded by pn junctions. The distance between these two adjacent channel zones determines the channel cross-section and is chosen in such a way as to achieve desired electrical properties of the JFET. Said further channel is controlled in a manner dependent on a potential at the channel zone.

Preferably, the at least one channel zone is adjoined by a compensation zone of the same conductivity type as the channel zone in order to form a compensation component. Compensation components and the advantages thereof are known in principle and described in the following publications, for example: U.S. Pat. Nos. 5,216,275 and 4,754,310, international PCT publication WO 97/29518, as well as German patents DE 43 09 764 C2 and DE 198 40 032 C1. In one embodiment of the invention it is provided that the further channel, which is part of a JFET, is formed between two mutually opposite sections of these compensation zones.

In one embodiment of the invention it is provided that the first terminal electrode is connected at a distance from the first terminal zone directly to the drift zone in the region of the front side of the semiconductor body, the second channel being formed below the front side adjacent to the channel zone and conducting or blocking according to a potential present at the channel zone. This results in the realization of a JFET in the semiconductor body in parallel with the normally off FET, in which case the JFET's channel formed by the second channel can be pinched off by means of the potential at the channel zone. Preferably, at least two channel zones are present, which are spaced apart in the lateral direction of the semiconductor body, the second channel being formed between two mutually opposite sections of these channel zones.

The invention furthermore relates to a method for producing a semiconductor component according to the invention having a first channel of a second conductivity type and a second channel of a first conductivity type between a first terminal zone and a drift zone.

The method according to the invention firstly provides for a semiconductor body or a semiconductor layer to be made available, which has a drift zone of a first conductivity type and also a channel zone of a second conductivity type, which is arranged in the drift zone in the region of a front side of the semiconductor body, a control electrode being arranged in a manner insulated from the semiconductor body above the front side of the semiconductor body. An arrangement of this type constitutes a customary intermediate product in the production of MOS transistors and can be produced by means of conventional production methods.

In this assembly, a cutout is produced in the control electrode, or in a layer which forms the later control electrode, above the channel zone, which cutout extends to above the drift zone in the lateral direction of the semiconductor body. Afterward, below the control electrode in the cutout, the channel is doped with dopants of the first conductivity type in order to form a channel of the first conductivity type in the channel zone, which forms the later second channel of the component. In this way, the second channel is produced in a self-aligned manner with regard to the control electrode since its position is prescribed by the cutout in the control electrode and the control electrode serves as a mask during the doping method.

In addition, a first terminal zone of the first conductivity type is formed in the channel zone, which adjoins the channel of the first conductivity type in the component. Said terminal zone may be produced after the production of the second channel of the first conductivity type, or said terminal zone may be produced before the production of the channel of the first conductivity type, the cutout for producing said channel being produced in the control electrode in such a way that it extends to above the first terminal zone in the lateral direction.

The first terminal zone, which forms the later source zone of the component, is produced by means of conventional methods, for example by producing a cutout in the control electrode above the channel zone, via which dopant atoms of the first conductivity type are implanted into the channel zone of the second conductivity type and outdiffused there. In this case, the control electrode serves as a mask for the implantation step.

The method according to the invention produces a semiconductor component in which a channel zone is formed between a first terminal zone and a drift zone, the channel zone forming a first channel of the second conductivity type in sections and a second channel of the first conductivity type being formed adjacent to such a first channel.

Preferably, the doping of the channel zone below the edges of the control electrode in order to produce the channel of the first conductivity type comprises the method steps explained below.

Firstly, charge carriers of the first conductivity type are implanted into the channel zone via the cutout, this implantation being effected directly into the channel zone if the cutout extends as far as the semiconductor body through the control electrode and an underlying insulation layer, and this implantation being effected through said insulation layer into the semiconductor body if the cutout in the control electrode only extends as far as the insulation layer. This implantation is followed by a diffusion step in order to drive the implanted dopant atoms in the semiconductor material under the edges of the control electrode in the channel zone. The implanted dopant atoms are then removed in the channel zone at the bottom of the cutout in such a way that dopant atoms remain under edges of the control electrode in the channel zone. This removal is effected for example by means of an anisotropic etching method using the cutout in the control electrode as a mask. Finally, the cutout is filled with an insulating filling material, for example a polyimide or a semiconductor oxide.

One embodiment provides for the channel of the first conductivity type to be produced by dopant atoms of the first conductivity type being implanted into the channel zone via the cutout at an implantation angle of greater than 0°, that is to say obliquely, as a result of which an implantation under the edges of the control electrode is effected. A diffusion step may optionally follow.

A further aspect of the invention provides for the semiconductor component according to the invention to be used in a switching converter which has a transformer having a primary coil and a secondary coil, a semiconductor switch being connected in series with the primary coil and a drive circuit for providing a drive signal for the semiconductor switch, which comprises a supply terminal. In this case, the first and second terminal zones of the semiconductor component according to the invention are connected between the primary coil and the supply terminal of the drive circuit.

Other features which are considered as characteristic for the invention are set forth in the appended claims.

Although the invention is illustrated and described herein as embodied in a field-effect-controllable semiconductor component and method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1A is a side view of a cross section through a first exemplary embodiment of a semiconductor component according to the invention;

FIG. 3A is a plan view onto a cross section through the semiconductor components in accordance with FIG. 1 and FIG. 2 in the case of an embodiment with a circular channel zone;

FIG. 3B is a plan view onto a cross section through the semiconductor components in accordance with FIG. 1 and FIG. 2 in the case of an embodiment with a strip-shaped channel zone;

FIG. 4 is a side view of a cross section through a third exemplary embodiment of a semiconductor component according to the invention;

FIG. 14B is a plan view of a semiconductor body in accordance with FIG. 8 after the introduction of dopant atoms into the channel zone;

DESCRIPTION OF THE PREFERRED EMBODIMENTS

Figure 1B:
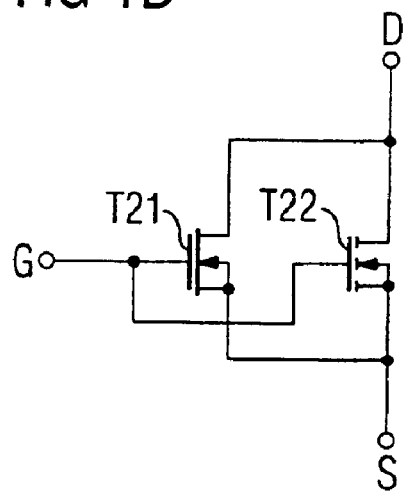
FIG. 1B is a electrical equivalent circuit diagram of the component.

Referring now to the figures of the drawing in detail and first, particularly, to FIG. 1A thereof, there is shown a first exemplary embodiment of a semiconductor component according to the invention in side view in cross section. At first glance this semiconductor component resembles a power MOSFET of cellular construction. The component comprises a semiconductor body 100 with a drift zone 3 of a first conductivity type, in which a plurality of channel zones 5A, 5B, 5C of a second conductivity type, complementary to the first conductivity type, are formed in the region of a front side 101 of the semiconductor body 100. Terminal zones 2 of the first conductivity type are embedded in said channel zones 5A, 5B, 5C likewise in the region of the front side 101, these first terminal zones 2 being contact-connected by means of a terminal electrode 22, said terminal electrode 22 extending right into the channel zones 5A, 5B, 5C through the first terminal zones 2 in the vertical direction of the semiconductor body 100 in order to short circuit the first terminal zones 2 and the channel zones 5A, 5B, 5C.

A control electrode 6 is present above the front side 101 of the semiconductor body 100. Several sections of the control electrode are illustrated in sectional illustration in accordance with FIG. 1. The control electrode 6 is adjacent to the channel zones and is insulated from the semiconductor body 100 and from the first terminal electrode 22 by means of an insulation layer 61.

Toward the bottom the drift zone 3 is adjoined by a second terminal zone 31 of the first conductivity type which is usually doped more heavily than the drift zone 3.

In the exemplary embodiment, the channel zones 5A, 5B, 5C are adjoined by compensation zones 8A, 8B, 8C doped with dopant atoms of the same conductivity type as the channel zones 5A, 5B, 5C, the doping ratios of the drift zone 3 and of the compensation zones 8A, 8B, 8C being chosen in a manner following the principle in the case of compensation components such that there are approximately as many dopant atoms of the first conductivity type in the drift zone 3 as there are dopant atoms of the second conductivity type in the compensation zones 8A, 8B, 8C, so that the compensation zones 8A–8C and the drift zone 3 can effect reciprocal depletion when the semiconductor component is in the off state.

The semiconductor component according to the invention furthermore comprises channels 71 of the first conductivity type which are formed between the first terminal zone 2 and the drift zone 3.

In the exemplary embodiment in accordance with FIG. 1, said channels 71 are formed in the channel zones 5A, 5C in the region of the front side 101 below the control electrode 6. The channels 71 extend in the lateral direction of the semiconductor body 100 from the first terminal zone 2 right into the region of the drift zone 3 which extends upward as far as the front side 101 of the semiconductor body 100. In the vertical direction of the semiconductor body, in the example, the channels 71 extend approximately as far as the lower edge of the first terminal zone 2. It should be pointed out that, depending on the desired electrical properties, these channels 71 can also end above the lower edge of the first terminal zone 2, that is to say can also extend less far into the semiconductor body 100 in the vertical direction than the terminal zone 2, in which case the doping concentration of the second channels 71 may then also be higher than the doping concentration of the drift zone 3.

Figure 1C:
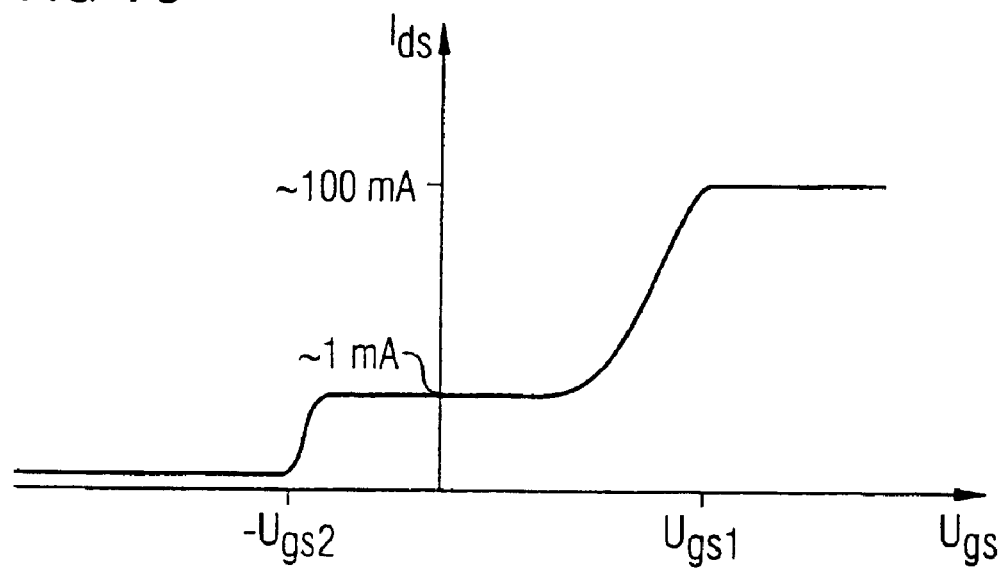
FIG. 1C is a graph plotting a characteristic curve of the component.

The component in accordance with FIG. 1A realizes a normally off MOSFET (enhancement-mode MOSFET) and a normally on MOSFET (depletion-mode MOSFET) in a semiconductor body. The electrical equivalent circuit diagram of this semiconductor component and the characteristic curve thereof are illustrated in FIGS. 1b and 1c. The first terminal electrode 21 forms the source electrode both of the normally off MOSFET and of the normally on MOSFET. The two components likewise share the drift zone 3 with the compensation zones 8A, 8B, 8C and the second terminal zone 31, the latter forming the drain zone of the two MOSFETs. The two MOSFETs likewise share the control electrode 6, which forms the gate electrode. FIG. 1a uses schematically depicted electrical connections to illustrate that the electrode sections shown there are electrically connected to one another or are part of only one continuous electrode which has contact holes in the region of contacts connecting the terminal electrode 22 to the first terminal zone 2 and the body zones 5A, 5B, 5C.

The channel zones 5A, 5B, 5C form channels 51 of the normally off MOSFET in regions below the front side 101 of the semiconductor body 100 and adjacent to the control electrode 6, the conduction behavior of these channels 51 being adjustable by means of a drive potential of the gate electrode 6. In the case of an n-conducting MOSFET, the first terminal zone 1, the drift zone 3 and the drain zone 31 and also the channels 71 are n-doped, while the channel zones 5A, 5B, 5C and the compensation zones 8A, 8B, 8C are p-doped. Upon application of a positive drain-source voltage, the pn junction formed between the channel 51 and the drift zone 3 effects blocking provided that a positive drive potential is not present at the control electrode 6.

In the case of an n-conducting MOSFET, the channels 71 realize an n-conducting connection between the first terminal zone 2 and the drift zone 3, so that a conducting channel exists between the first terminal zone 2 and the drift zone 3 even in the event of a drive potential of 0 volts at the gate electrode 6.

The method of operation of the semiconductor component in accordance with FIG. 1A is explained below with reference to the family of characteristic curves in FIG. 1C, it being assumed for the family of characteristic curves that the component illustrated is an n-conducting component in which the source zone 2, the drift zone 3, the drain zone 31 and also the channel zone 71 are n-doped, while the channel zones 5A, 5B, 5C, also referred to as body zones, and also the compensation zones 5A, 5B, 5C are p-doped. The characteristic curve in FIG. 1c illustrates the current between the drain zone D, 31 and the source electrode S, 22 for a given positive drain-source voltage, depending on the potential at the gate electrode or a gate-source voltage $U_{gs}$ between the gate electrode 6 and the source electrode S, 22. The characteristic curve shows that a current already flows for gate-source voltages of 0 V, that current being made possible through the normally on channels 71. This current rises with increasing gate-source voltage $U_{gs}$ upon reaching a threshold voltage $U_{gs}1$, said threshold voltage $U_{gs}1$ being determined through the fact that n-type charge carriers accumulate in the region of the channels 51 in the channel zones 5A, 5B, 5C and provide an n-conducting connection between the source zone 2 and the drift zone 3. The semiconductor component is fully switched on when said threshold voltage is exceeded.

If the gate-source voltage $U_{gs}$ is reduced toward negative values, then the drain-source current decreases greatly in the event of a negative threshold voltage $-U_{gs}2$ being reached and approaches the value 0 to an approximation. In this switching state, the n-doped channels 71 are pinched off due to the negative gate-source voltage $U_{gs}$. The component turns off completely, a current which still flows upon application of a drain-source voltage resulting from unavoidable leakage losses.

The ratio of the current in the case of a gate-source voltage of 0 V and of the current in the fully switched-on state after the threshold voltage $U_{gs}1$ has been exceeded can be set by way of the ratio of the cross sections of the normally off channels 51 to the cross sections of the normally on channels 71 and by way of the doping of the normally on channels.

Preferably, the total cross section of the normally on channels 71, which results from the sum of the individual cross sections of all the channels 71, is small in relation to the total channel cross-sections of the normally off channels 51, which results from the sum of the individual cross sections of all the channels 51. This can be achieved for example in that channels 71 of the first conductivity type are provided only in some of the channel zones, in the channel zones 5A, 5C in the example, and that, moreover, at a channel zone 5A, 5C at which both normally off channels 51 and normally on channels 71 are present, the dimensions of the normally on channels 71 are small in relation to the dimensions of the normally off channels 51, as is explained below with reference to FIG. 3.

FIG. 3 shows a cross section through the semiconductor component in accordance with FIG. 1A in the sectional plane I—I depicted in FIG. 1A. In this case, FIG. 3 shows two different exemplary embodiments in FIGS. 3A and 3B, cross sections along the section lines II—II in the semiconductor components in accordance with FIGS. 3A and 3B leading to the illustration in accordance with FIG. 1A.

FIG. 3A shows an exemplary embodiment in which the channel zones 5A, 5C are formed in circular fashion in the drift zone 3. In this illustration, the channel zones 5A, 5C are formed in annular fashion around the first terminal zones 2, the channels of the first conductivity type 71 being sectors of this annulus. In the example in accordance with FIG. 3, dimensions of these sectors are small relative to the entire periphery, in order to set the desired ratio between the current via the channels 71 and the channels 51. Preferably, a plurality of such channels 71 are distributed over this annular section of the channel zone 5C, as is depicted in dash-dotted fashion in FIG. 3A.

The terminal pins of the source electrode 22 which make contact with the source zone are hexagonal in the exemplary embodiment, an overlying contact hole of the gate electrode, depicted in dashed fashion in FIG. 3A, likewise being hexagonal.

FIG. 3B shows an exemplary embodiment in which the channel zones 5A, 5C are formed in elongated fashion in the lateral direction of the semiconductor body 100, the source zone 2, the terminal contacts, source electrode 22 and also the overlying gate electrode, depicted in dashed fashion in FIG. 3B, likewise being formed in elongated fashion. In this case, the dimensions of the channels 71 of the first conductivity type in the lateral direction are small compared with the dimensions of the channel zones 5A, 5C or the normally off channels in said channel zones 5A, 5C.

Figure 2:
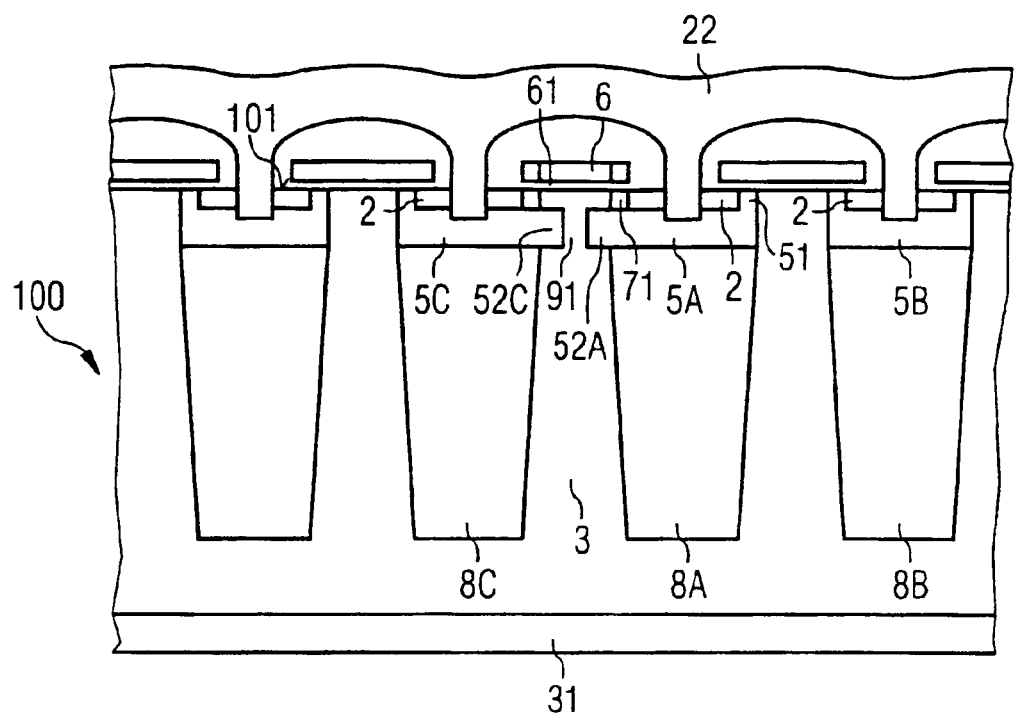
FIG. 2 is a side view of a cross section through a second exemplary embodiment of the semiconductor component according to the invention.

FIG. 2 shows a modification of the semiconductor component illustrated in FIG. 1A, in this semiconductor component a further channel 91 of the first conductivity type being formed between the first terminal zone 2 and the drift zone 3 besides the channels 71 of the first conductivity type. This further channel 91 is bounded by two channel zones 5A, 5C arranged in a manner spaced apart in the lateral direction, said channel zones 5A, 5C having widened portions 52A, 52C in the lateral direction in comparison with the remaining channel zones 5B, the channel 91 being formed between said widened portions, so that the channel zones 5A, 5C lie closer together below the normally on channels 71 than in the remaining regions, in which the channel zones, for example the channel zones 5A, 5B, are likewise arranged adjacent, but in which normally off channels 51 are present rather than normally on channels 71.

The configuration with the sections 52A, 52C of the channel zones 5A, 5C and the channel 91 of the first conductivity type which lies in between functions in the manner of a JFET, the channel 91 being pinched off depending on the potential at the channel zones 5A, 5C if space charge zones form proceeding from the pn junctions, which space charge zones make contact in the center of the channel 91.

In the case of the component in accordance with FIG. 2, the normally on FET is thus formed by a combination of a depletion-mode FET and a JFET. The channel 91 is pinched off at a maximum current Imax. The channel zones 5A, 5C or 52A, 52C are connected to source potential via the electrode 22. The channel 91 is at a potential which is higher than source potential and is proportional to a current I through the channel 91 and the resistance of the channel 71. If the current I through the channel 91 reaches the maximum current Imax, then the channel 91 is pinched off. The current flowing through the channel 91 is thus limited to a value below the maximum current Imax. By virtue of this current-limiting effect, the structural region with the channels 71 and 91 functions in the manner of a constant-current source.

The cross sections illustrated in FIGS. 3A and 3B also apply to the semiconductor component in accordance with FIG. 2.

FIG. 4 shows a modification of the exemplary embodiment in accordance with FIG. 2, in this exemplary embodiment a channel 92 of the second conductivity type running between sections of the compensation zones 8A, 8C. The compensation zones 8A, 8C have widened portions 81A, 81C in this region in order to define the cross section of the channel 92, this channel cross section 92 being significantly smaller than the distance between the channel zones 8A, 8B in those regions in which no channels 71 of the first conductivity type are arranged above.

Figure 5:
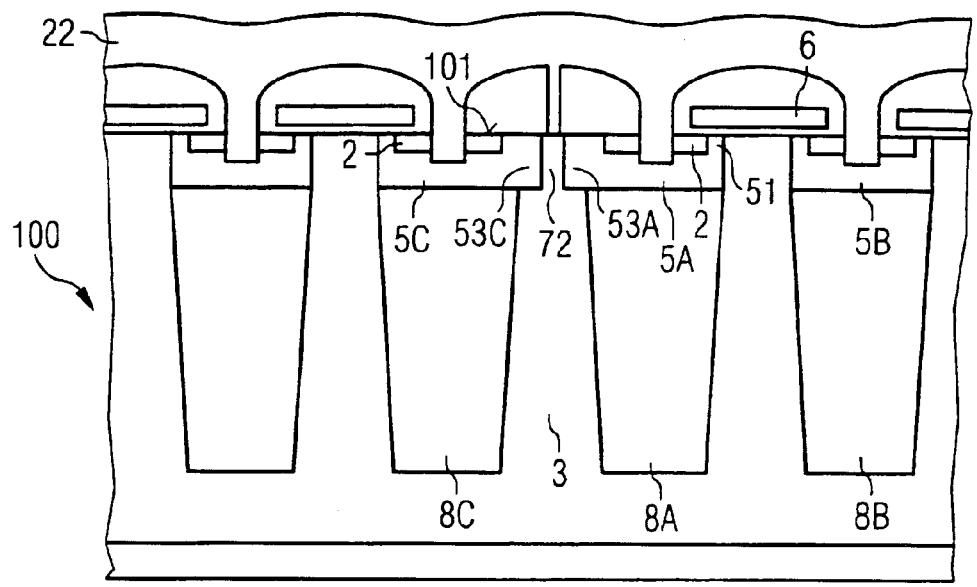
FIG. 5 is a side view of a cross section through a fourth exemplary embodiment of a semiconductor component according to the invention.

A further embodiment of a semiconductor component according to the invention is illustrated in FIG. 5. This semiconductor component differs from that illustrated in FIGS. 1 to 4 by the fact that no channels of the first conductivity type are arranged in the channel zones 5A, 5C. In this exemplary embodiment in accordance with FIG. 5, a channel 72 of the first conductivity type is formed between the first terminal electrode 22 and the drift zone 3 by virtue of the fact that the first terminal electrode 22 directly makes contact with the semiconductor body 100 in the region of the front side 101 in such a region in which the drift zone 3 extends between two adjacent channel zones 5A, 5C as far as the front side 101 of the semiconductor body 100. In this case, the channel 72 is formed between two channel zones 5A, 5C spaced apart in the lateral direction, said channel zones 5A, 5C being widened in the region of the channel 72 in the lateral direction by sections 53A, 53C of the second conductivity type in order to define the channel width of the channel 72. The adjacent channel zones 5A, 5C are thus spaced apart more narrowly in the region of the channel 72 than in remaining regions, for example in the region between the channel zones 5A and the channel zone 5B, in which there is no channel 72 of the first conductivity type connected to the terminal electrode 22. In the region of the contact 212 connecting the terminal electrode 22 to the semiconductor body 100, no gate electrode is present or sections of the gate electrode 6 are removed.

The channel 72 of the first conductivity type with the sections 53A, 53C of the second conductivity type which bound it forms a JFET together with the first terminal electrode 22, the drift zone 3 and the second terminal zone or drain zone 31, in which case the channel of this JFET can be pinched off by way of the potential at the channel zones 5A, 5C. This potential at the channel zones 5A, 5C corresponds to the source potential owing to the short circuit of the source zones 2 and the channel zone 5A, 5C. The potential of this channel 72 is raised by a current flowing through the channel, the channel effecting blocking on reaching a maximum current and thus limiting the current flow.

Figure 6:
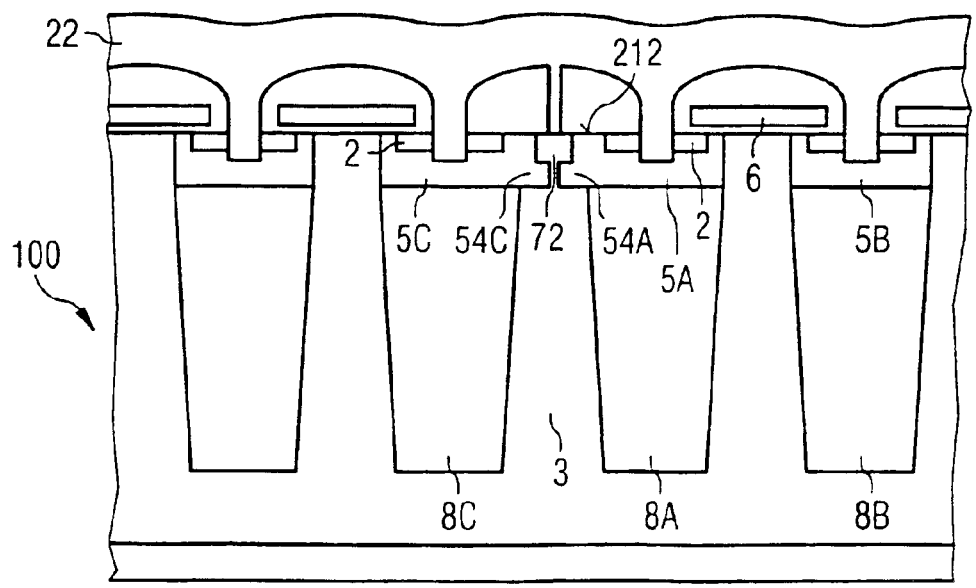
FIG. 6 is a side view of a cross section through a fifth exemplary embodiment of a semiconductor component according to the invention.

FIG. 6 shows a modification of the semiconductor component in accordance with FIG. 5, the semiconductor component in accordance with FIG. 6 differing from that illustrated in FIG. 5 by the fact that the channel 72 of the first conductivity type tapers toward the drift zone 3 proceeding from the front side 101 in the vertical direction. This is achieved by virtue of the fact that the channel zones 5A, 5C which define the channel 72 and are arranged in a manner spaced apart in the lateral direction have doped sections 54A, 54C of the second conductivity type in this region, which sections are formed for example in stepped fashion in order thus to obtain a channel 72 with a larger channel width directly below the front side 101 and a channel with a smaller channel width at a distance from the front side 101.

Figure 7A:
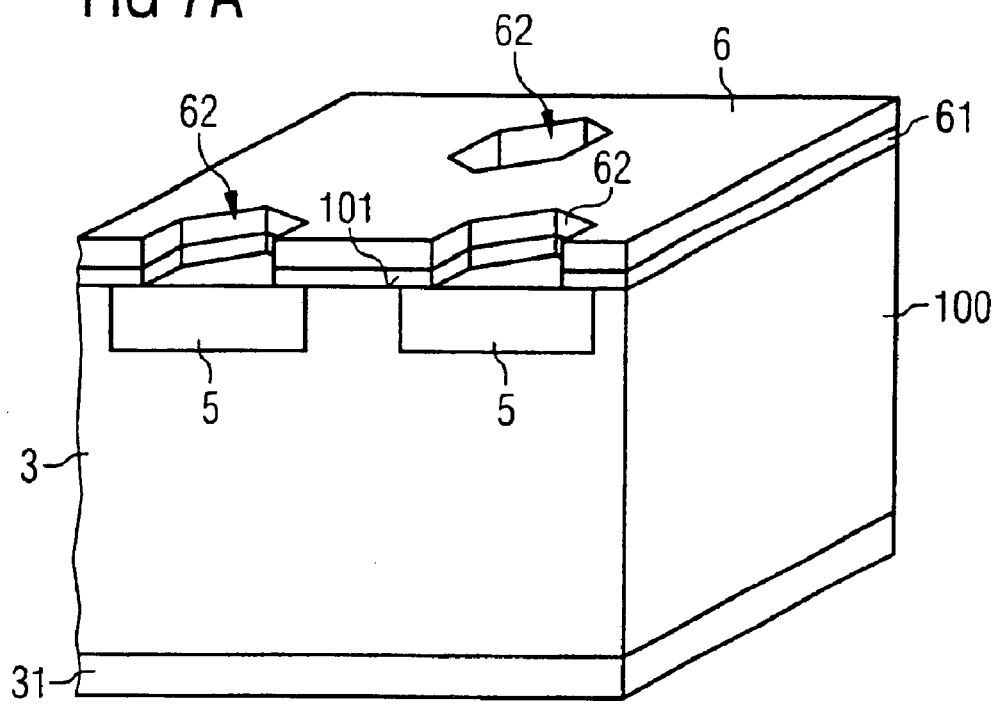
FIG. 7A is a perspective sectional illustration of a semiconductor body with a drift zone, a channel zone, and a control electrode with hexagonal contact holes in the control electrode, which constitutes an intermediate product of the production method according to the invention.
Figure 7B:
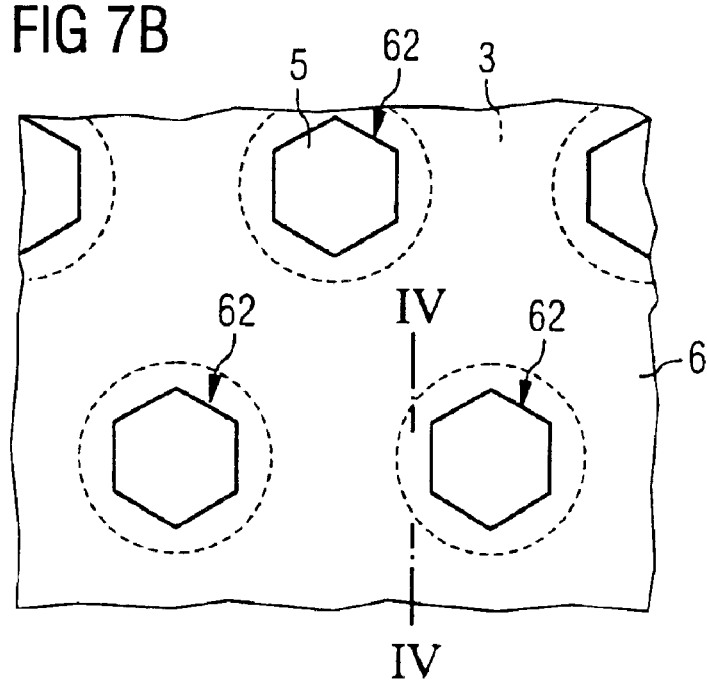
FIG. 7B is a plan view thereof.

A method for producing a semiconductor component according to the invention, in which a normally off FET and a normally on FET are integrated in a semiconductor body, is explained below with reference to FIGS. 7 to 16. FIG. 7 shows in perspective view (FIG. 7A) and in plan view (FIG. 7B) a semiconductor arrangement which forms the starting point of the method according to the invention and can be produced by means of conventional methods known in semiconductor technology and results as an intermediate product during the production of power MOSFETs of cellular construction. The arrangement comprises a semiconductor body 100, which has a terminal zone 31, the later drain zone of the first conductivity type and a drift zone 3 of the first conductivity type applied to the first terminal zone 31, the drift zone 3 usually being more lightly doped than the terminal zone. The first terminal zone 31, not illustrated true to scale, is a semiconductor substrate, for example, to which the drift zone 3 is applied by means of epitaxy. A control electrode layer 6 is applied to a front side 101 of the semiconductor body above the drift zone 3 and is insulated from the semiconductor body 100 by means of an insulation layer 61 lying in between, for example a semiconductor oxide, such as e.g. silicon dioxide. In the exemplary embodiment, the control electrode layer 6 and the insulation layer 61 have hexagonal contact holes 62 extending as far as the front side 101 of the semiconductor body. Below said contact holes 62, channel zones 5 of the second conductivity type are introduced into the drift zone 3. Said channel zones 5 are approximately circular in plan view, as is depicted in dashed fashion in FIG. 7B. Said channel zones 5 are produced for example by a procedure in which, in the region of the contact holes 62, doping atoms of the second conductivity type are implanted into the semiconductor body 100 and subsequently outdiffused in order in this way to obtain channel zones 5 whose dimensions in the lateral direction are greater than the dimensions of the contact holes 62.

Figure 8A:
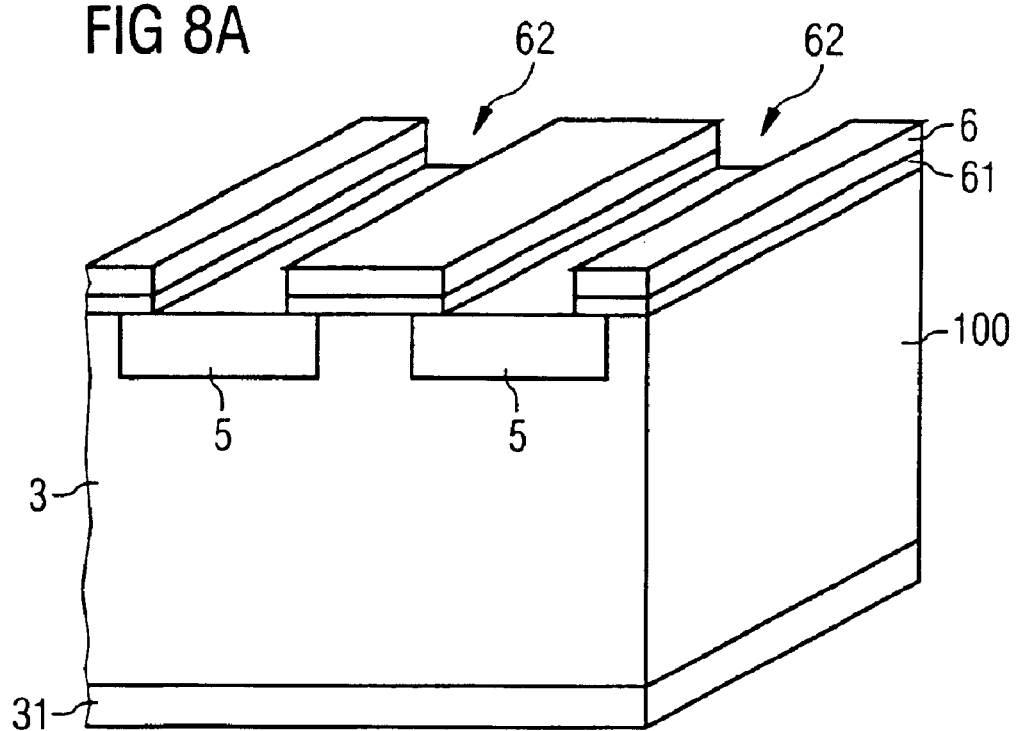
FIG. 8A is a perspective sectional illustration of a semiconductor body with a drift zone, a channel zone, and a control electrode with elongated contact holes in the control electrode, which constitutes an intermediate product of the production method according to the invention.

FIG. 8 shows in detail fashion in perspective illustration (FIG. 8A) and in plan view (8B) a further exemplary embodiment of a semiconductor arrangement as starting arrangement for the method according to the invention. This semiconductor arrangement in accordance with FIG. 8 differs from that illustrated in FIG. 7 by virtue of the geometry of the contact holes or cutouts 62 in the electrode layer applied above the semiconductor body 100. In the example in accordance with FIG. 8, said cutouts are formed in elongated or strip-type fashion in the lateral direction of the semiconductor body. The channel zones 5 run in correspondingly elongated fashion below the cutouts 62 in the semiconductor body 100. The dashed lines in FIG. 8 illustrate the junction between the channel zone 5 and the drift zone 3 below the control electrode 6.

Figure 8B:
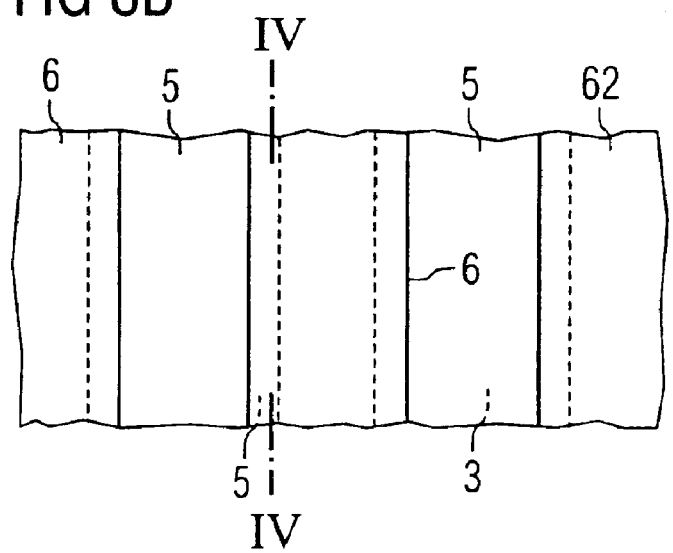
FIG. 8B is a plan view thereof.
Figure 9:
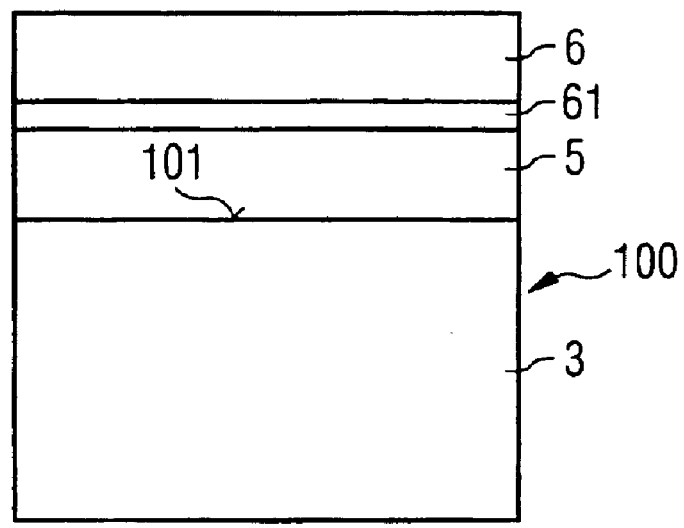
FIG. 9 is a detail from a semiconductor body according to FIG. 7 or 8.

FIG. 9 shows a cross section through the semiconductor arrangement in accordance with FIGS. 7 and 8 along the section lines IV—IV depicted in FIGS. 7B and 8B.

Figure 10:
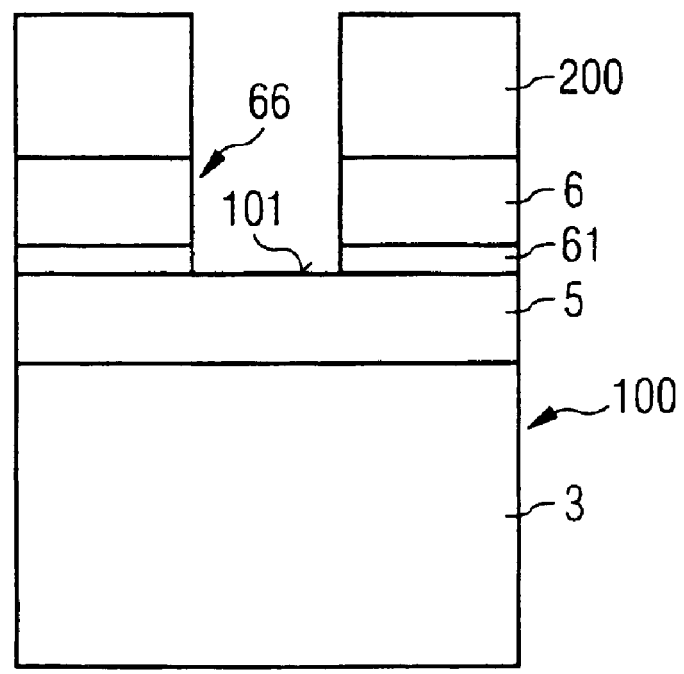
FIG. 10 is the same detail as in FIG. 9 after the production of a cutout in the control electrode.

FIG. 10 shows this detail after a first method step, in which, using a mask 200, in particular a resist mask, a trench 66 was introduced into the electrode layer 6 and the insulation layer 61, said trench extending as far as the front side 101 of the semiconductor body.

Figure 11A:
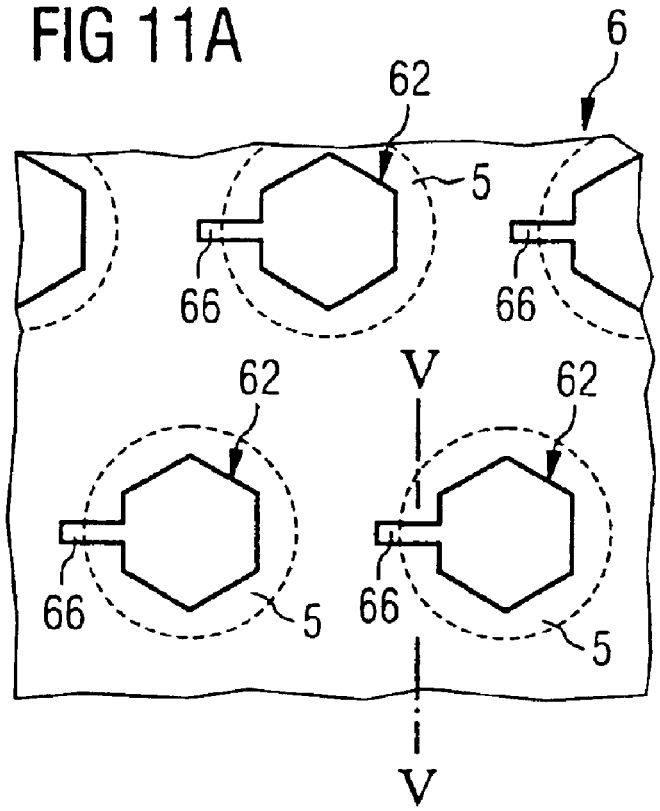
FIG. 11A is a plan view of a semiconductor body in accordance with FIG. 7 after the production of the cutout.
Figure 11B:
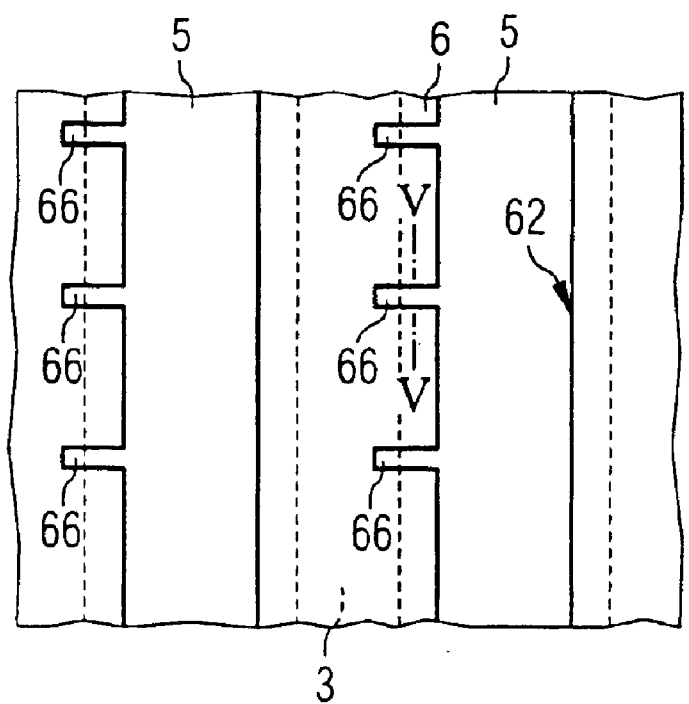
FIG. 11B is a plan view of a semiconductor body in accordance with FIG. 8 after the production of the cutout.

FIG. 11A shows a plan view, without a resist mask, of an arrangement in accordance with FIG. 7 after the production of said trench 66, and FIG. 11B shows an arrangement in accordance with FIG. 8 after the production of said trench 66. It is evident therefrom that the trench or trenches 66 is or are produced in the electrode layer 6 above the channel zone 5 in such a way that they extend from the contact holes 62 to above the drift zone 3. In the exemplary embodiment in accordance with FIG. 11A, such a trench 66 is produced with respect to each contact cutout 62 of the electrodes 6. In the exemplary embodiment in accordance with FIG. 11, a plurality of such trenches 66 are produced in a manner spaced apart in the lateral direction along the cutout 62 in the electrode layer 6.

Figure 12:
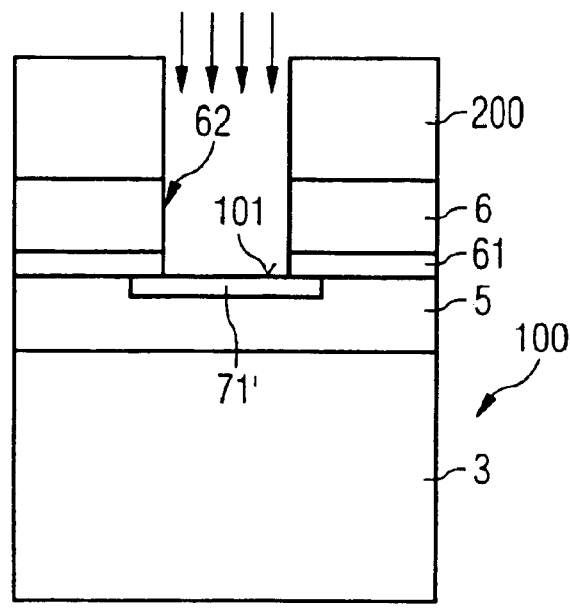
FIG. 12 is a side view of the detail in accordance with FIG. 10, after the introduction of dopant atoms into the channel zone.

FIG. 12 shows a detail along the section lines V—V in FIGS. 11A and 11B which corresponds to the detail along the section line IV—IV in FIGS. 7A and 7B, during a further method step. In this method step, the resist mask 200 is still applied to the control electrode 6, said resist mask being omitted in the illustration of FIGS. 11A and 11B. Using this resist mask 200, dopant atoms of the first conductivity type are introduced into the channel zone 5 via the cutout 62 in the electrode layer 6 and the insulation layer 61 in such a way as to produce a doped zone 71' of the first conductivity type, which extends to below the electrode 6 in the channel zone 5.

This doped zone 71' is produced for example by implanting dopant atoms of the first conductivity type into the channel zone 5, this implantation method being followed by a diffusion method in order to drive out the implanted dopant atoms in particular under the edges of the control electrode 6 in the channel zone 5.

In a further possible method for producing said doped zone 71', provision is made for implanting the dopant atoms into the channel zone 5 obliquely, i.e. at an angle of greater than 0°, with respect to the perpendicular, so that, as early as during the implantation step, dopant atoms of the first conductivity type are implanted under the edges of the control electrode 6 of the channel zone 5.

Figure 13:
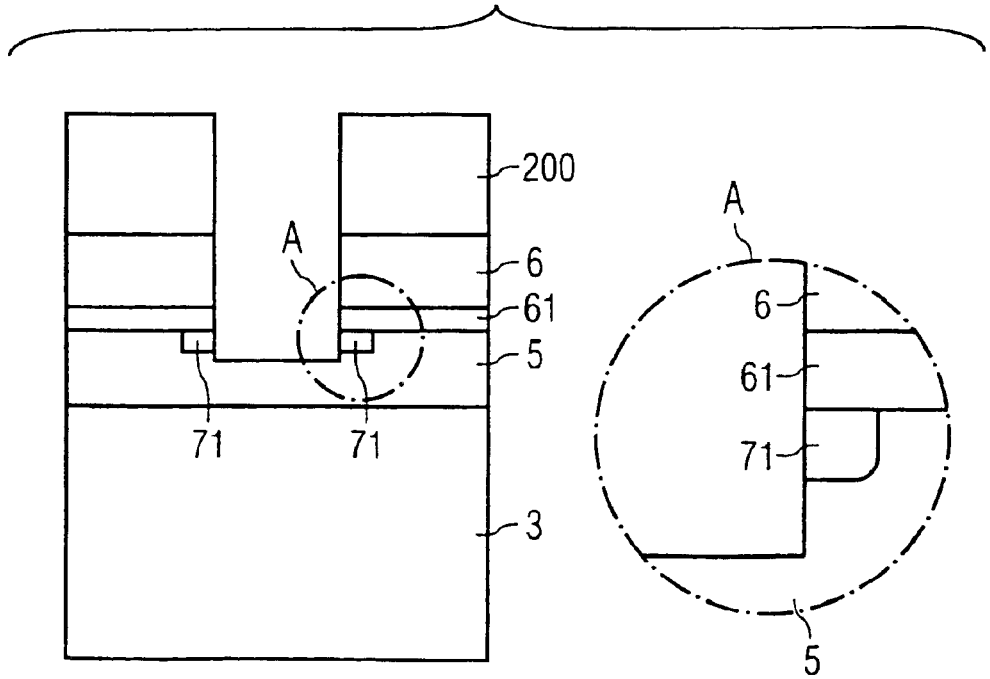
FIG. 13 is the detail in accordance with FIG. 12, after the partial removal of the channel zone below the cutout.

In next method steps, the result of which is illustrated in FIG. 13, the doped layer 71' is partly removed in such a way that only doped regions 71 remain below the electrode 6 or the insulation layer 61. This partial removal of the doped layer 71' is effected for example by means of anisotropic etching method using the resist mask 200 or a hard mask, this etching method causing the trench 62 in the electrode layer 6 and the insulation layer 61 to be extended into the channel zone 5 to below the doped layer 71 in order thus to remove the doped zone 71' and parts of the channel zone 5. The detail A marked by a broken line in FIG. 13 is shown enlarged beside the detail illustration V—V in FIG. 13.

While the trench 62 extends as far as the front side 101 of the semiconductor body in the figures explained above, another embodiment (not illustrated) provides for said trench firstly to be advanced only as far as the insulation layer 61 and for the implantation to be carried out through said insulation layer 61 into the channel zone 5. It is not until during the etching method for the partial removal of the doped layer 71' that the insulation layer 61 is then removed above the semiconductor body 100.

Figure 14A:
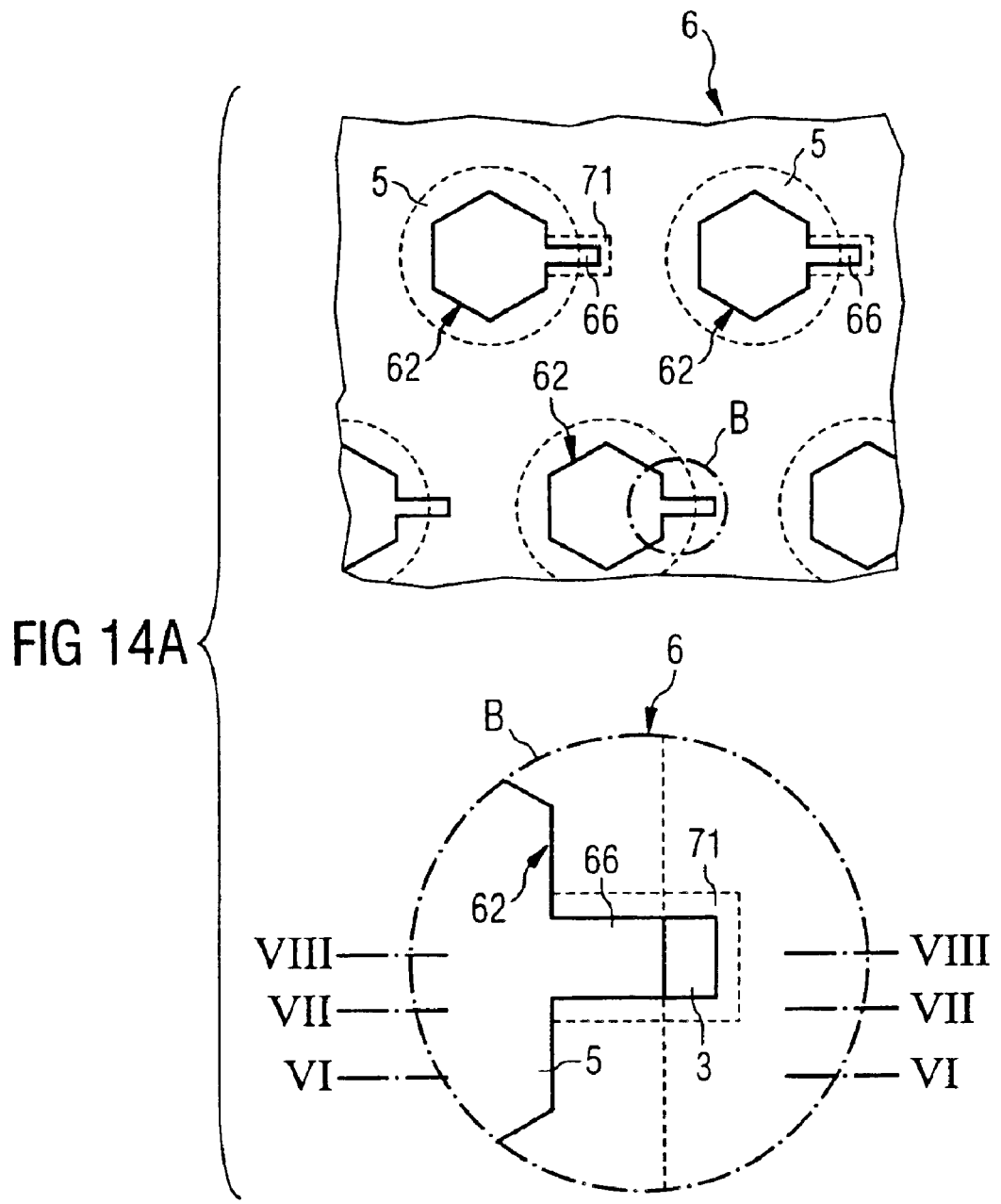
FIG. 14A is a plan view of a semiconductor body in accordance with FIG. 7 after the introduction of dopant atoms into the channel zone.

FIG. 14A shows an arrangement in accordance with FIG. 7 with hexagonal cutouts 62 in the electrode layer after the method steps explained with reference to FIG. 13. FIG. 14B shows a device in accordance with FIG. 8 after these method steps. It becomes clear therefrom that the doped zones 71 extend in the channel zone below the control electrode 6 from the cutouts 62 right into the drift zone 3.

Figure 15:
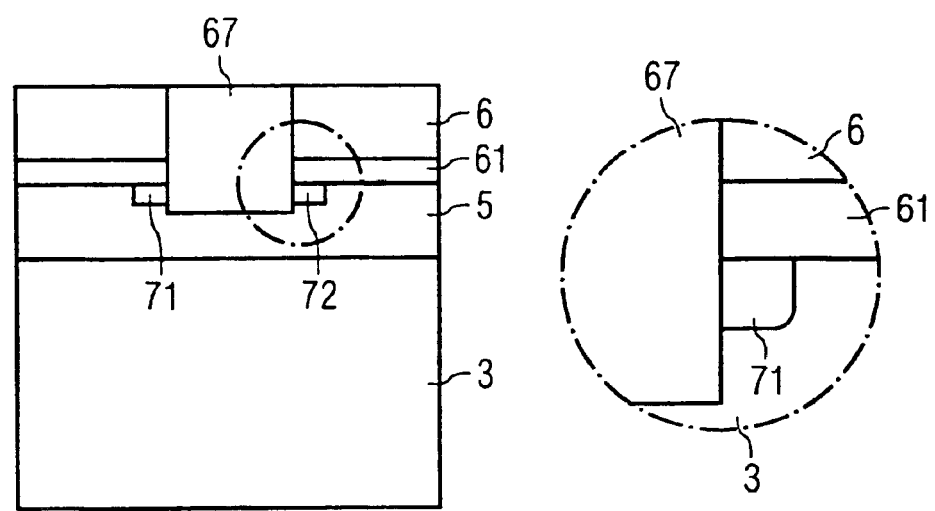
FIG. 15 is the detail in accordance with FIG. 13 after the filling of the cutout with a filling material.

In next method steps, the trench 62 is filled with an insulation layer 67, and the mask 200 above the electrode layer 6 is removed. FIG. 15 shows the semiconductor component in a sectional illustration which corresponds to the sectional illustration in FIGS. 9, 10, 12 and 13, after this next method step. Only the trenches 66 which extend from the contact holes 62 to above the drift zone 3 are filled in this case. In this case, the contact holes 62 are initially not filled or are opened again after being filled.

There then follow conventional method steps for producing a terminal zone of the first conductivity type, which serves as source zone of the semiconductor component. These method steps comprise, by way of example, the implantation of dopant atoms of the first conductivity type into the channel zone 5 using the cutouts 62 as a mask and the subsequent outdiffusion of these dopant atoms under the edges of the electrode layer 6 in the region of the cutouts 62. Finally, an insulation layer is applied to the top side of the electrode layer 6 and to uncovered regions of the electrode layer 62 and a contact hole is introduced into the semiconductor body 100, said contact hole extending through the second terminal zone 2 right into the channel zone 5. Finally, an electrode layer 62 is deposited, which fills the contact hole and covers the insulation layer above the electrode 6 and serves as source electrode of the component. FIG. 16 shows a resultant semiconductor component in three different sectional planes which correspond to the sectional planes VI, VII and VIII depicted in FIGS. 14A and 14B.

Figure 16A:
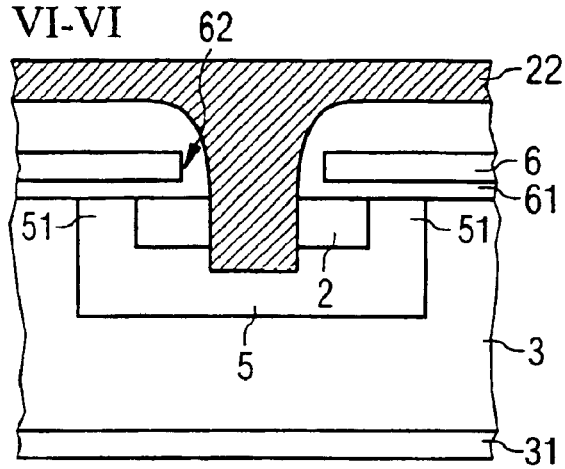
FIGS. 16A, 16B, and 16C are cross sections taken through the configuration in accordance with FIG. 14, in three sectional planes perpendicular to the sectional plane of FIG. 14.

The cross section along the sectional plane VI—VI illustrated in FIG. 16A is like a partial cross section through a conventional normally off power MOSFET. In this case, a channel zone 5 of the second conductivity type is arranged in the drift zone 3 of the first conductivity type, a first terminal zone 2 of the first conductivity type being arranged in turn in the channel zone 5, said first terminal zone being contact-connected by means of a terminal electrode 22, the terminal electrode 22 short-circuiting the first terminal zone 2, that is to say the source zone, and the channel zone, that is to say the body zone. The control electrode 6, which forms the gate electrode, is situated above the semiconductor body 100 adjacent to the body zone 5 and runs in the lateral direction between the source zone 2 and the drift zone 3. Below the gate electrode 6, a channel 51 is formed in the channel zone 5, which channel effects blocking in the voltageless state of the semiconductor component and conducts if a positive voltage is applied between the gate electrode 6 and the source electrode 22 or the source zone 2.

Figure 16B:
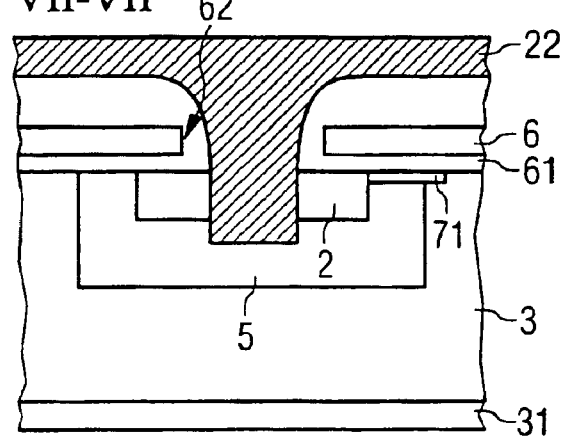

The special nature of the semiconductor component according to the invention is shown in the cross section VII—VII illustrated in FIG. 16B. It becomes clear therefrom that the semiconductor component according to the invention has besides the normally off channel 51 in the channel zone 5 a channel 71 of the first conductivity type which extends from the source zone 2 right into the drift zone 3, said channel 71 of the same conductivity type as the source zone 2 and the drift zone 3 already conducting when no drive potential is applied to the gate electrode 6. This conducting channel 71 results from the doped layer 71' of the first conductivity type whose production has been explained with reference to FIGS. 12 and 13. If the contact holes 62 of the electrode are not covered during the production of this doped layer 71', this doped layer 71' originally also extends over regions of the channel zone 5 below the contact holes 62. However, these regions, for the production of the source zone 2, are subsequently heavily doped with charge carriers of the first charge type, so that the channel zone doping resulting from this layer 71' is no longer significant afterward, so that the resultant channel 71 of the first conductivity type is illustrated exclusively between the terminal zone 2 and the drift zone 3 in the channel zone 5 in FIG. 16B.

Figure 16C:
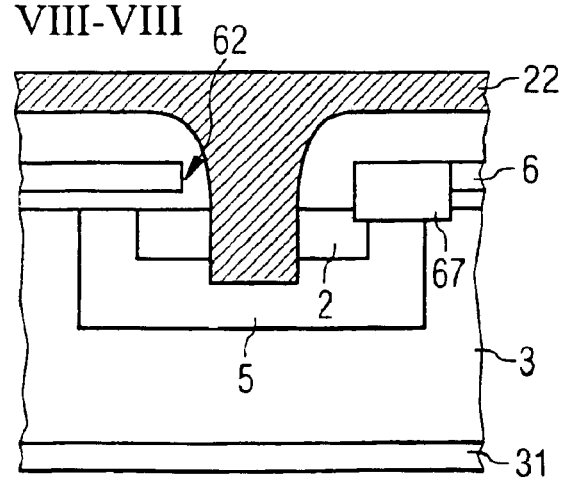

FIG. 16C shows the cross section through the semiconductor component in the region of the original trench 66, which is now filled with the insulation material 67. The channel zone of the second conductivity type is situated below said insulation material 67, so that no conducting channel can be formed between the source zone and the drift zone 3 for lack of a control electrode in this region, independently of the voltage applied to the control electrode.

Figure 17A:
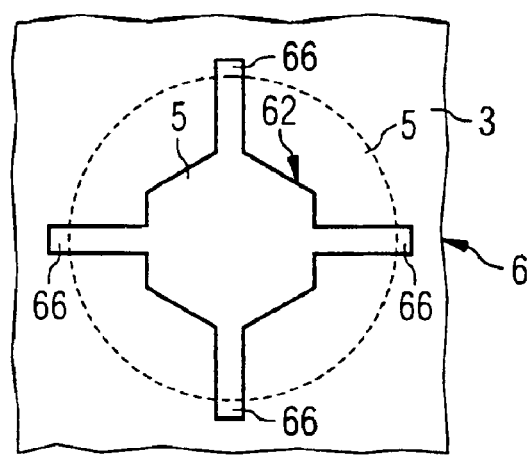
FIGS. 17A, 17B, and 17C are plan views of a semiconductor component after a method step in which cutouts were produced in the control electrode above the channel zone.
Figure 17B:
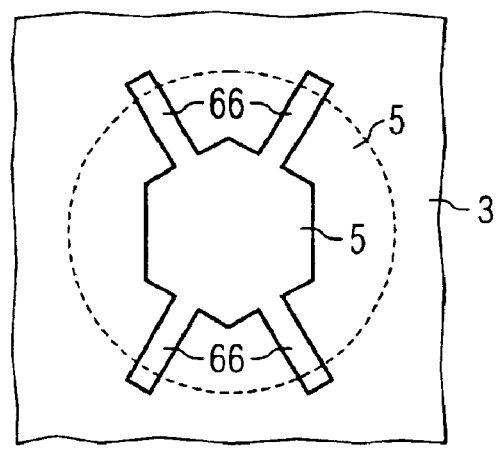
Figure 17C:
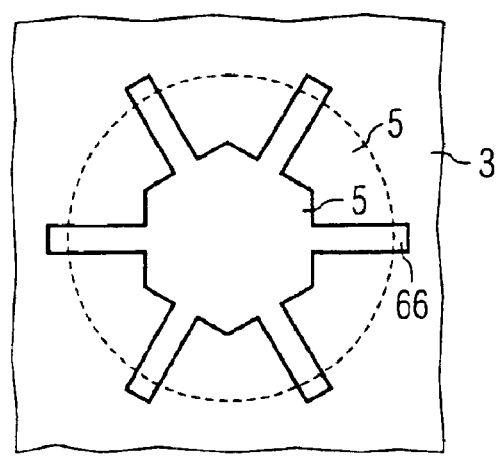

In the semiconductor component according to the invention, the channel 71 of the first conductivity type in the channel zone 5 is part of a normally on FET, while the remaining regions 5 of the channel zone, namely the channels 51, are part of a normally off FET. The current of the semiconductor component when a voltage is applied between the first terminal zone 2 or the first terminal electrode 22 and the second terminal zone 31 is adjustable by way of the number of normally on channels 71 in the channel zone 5. FIG. 17 shows an illustration corresponding to FIG. 11a for a plurality of exemplary embodiments in which more than one channel is provided proceeding from the hexagonal contact hole 62. The method according to the invention also affords the possibility of effecting cellwise variation, i.e. of implementing one or a plurality of such normally on channels in one of the channel zones 5, while no such normally on channels are implemented in other channel zones.

Figure 18:
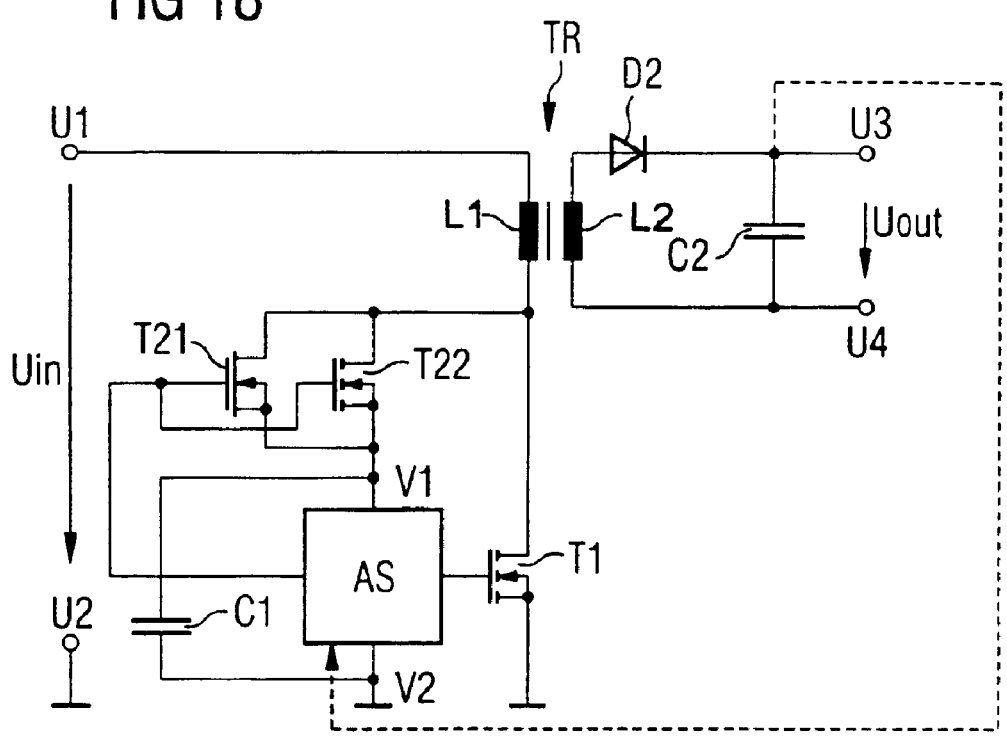
FIG. 18 is a circuit diagram of a switched-mode power supply, as an exemplary application for the semiconductor component according to the invention.

FIG. 18 shows a possible application example of a semiconductor component according to the invention, in which a normally off FET and a normally on FET are integrated in a semiconductor body. This exemplary application relates to a switched-mode power supply with input terminals K1, K2 for the application of an input voltage Uin and output terminals K3, K4 for the provision of an output voltage Uout. The switched-mode power supply comprises a transformer TR having a primary coil L1 and a secondary coil L2, the primary coil L1 being connected in series with a power transistor and this series circuit being connected to the input voltage Uin. A rectifier arrangement with a diode D2 and a capacitor C2 is connected to the secondary coil L2, it being possible to tap off the output voltage Uout across the capacitor C2. The power transistor T1 is driven in pulsed fashion by means of a drive circuit AS, the duty ratio with which the transistor T1 is turned on and off determining the power consumption of the switched-mode power supply and thus the output voltage. The drive circuit AS is supplied with an item of information about the output voltage Uout, as illustrated in dashed fashion in FIG. 18, in order to set the duty ratio in such a way that the output voltage is at least approximately constant in a load-independent manner.

The drive circuit AS has supply terminals V1, V2, a semiconductor component according to the invention, which is illustrated as a parallel circuit comprising a normally on FET T21 and a normally off FET T22 in the equivalent circuit diagram in FIG. 18, being connected between the primary coil L1 and the supply terminal V1 of the drive circuit AS. A supply capacitor C1 is connected between said supply terminals V1, V2. When an input voltage Uin is applied, if said supply capacitor C1 is not yet charged and the drive circuit AS cannot yet drive the power transistor T1, said supply capacitor is charged via the normally on transistor T21 until the voltage supply of the drive circuit AS suffices for driving the power transistor T1. The drive circuit AS furthermore drives the semiconductor component T21, T22 according to the invention in order to fully activate the semiconductor component according to the invention for example shortly before or shortly after the switch-on of the power transistor T1 and thereby to repeatedly charge the supply capacitor C1.

The semiconductor component with the normally off transistor T22 and the normally on transistor T21 for the voltage supply of the drive circuit AS and also the load transistor T1 are preferably integrated in a common chip or on separate chips in a common housing.

We claim:

1. A semiconductor component, comprising:
   at least one first terminal zone of a first conductivity type formed in a semiconductor body, and a first terminal electrode contact-connected to said first terminal zone;
   a drift zone of the first conductivity type, and a second terminal zone of a second conductivity type adjoining said drift zone;
   a channel zone of the second conductivity type disposed between said at least one first terminal zone and said drift zone, and a control electrode insulated from said semiconductor body and adjacent said channel zone;
   said channel zone having a first channel in a region adjacent said control electrode, and said first channel conducting only upon application of a non-zero control voltage between said control electrode and said first terminal zone; and
   at least one second channel of the first conductivity type connecting said first terminal electrode to said drift zone, said at least one second channel already conducting when the control voltage equals zero.

2. The semiconductor component according to claim 1, which comprises at least one compensation zone of the second conductivity type adjoining said channel zone and adjacent said drift zone.

3. The semiconductor component according to claim 1, wherein said first terminal zone is disposed below a front side of the semiconductor body, said control electrode is disposed arranged above the front side and insulated from said semiconductor body, and said second channel of the first conductivity type is formed between said front side and said channel zone below said control electrode.

4. The semiconductor component according to claim 3, wherein said first channel is formed by a region of said channel zone below said control electrode and adjacent said second channel.

5. The semiconductor component according to claim 3, wherein said channel zone is one of at least two channel zones, and a second channel of the first conductivity type is formed only between one of said channel zones and said front side of said semiconductor body.

6. The semiconductor component according to claim 3, wherein a further channel of the first conductivity type is disposed between said second channel and said drift zone, and said further channel is controlled by a potential at said channel zone.

7. The semiconductor component according to claim 6, wherein said channel zone is one of at least two channel zones, disposed spaced apart in a lateral direction of said semiconductor body, and said further channel is formed between two mutually opposite sections of said at least two channel zones.

8. The semiconductor component according to claim 6, wherein said channel zone is one of at least two channel zones with adjoining compensation zones, and said further channel is formed between two mutually opposite sections of said compensation zones.

9. The semiconductor component according to claim 1, wherein said first terminal electrode makes direct contact with said drift zone at a front side of said semiconductor body at a spacing distance from said first terminal zone, said second channel is formed below the front side adjacent said channel zone, and said second channel is configured to conduct or block according to a potential present at said channel zone.

10. The semiconductor component according to claim 9, wherein said channel zone is one of at least two channel zones spaced apart in a lateral direction of said semiconductor body, and said second channel is formed between two mutually opposite sections of said at least two channel zones.

11. A switching converter, comprising:
    the semiconductor component according to claim 1;
    a transformer having a primary coil and a secondary coil;
    a semiconductor switch connected in series with said primary coil; and
    a drive circuit for providing a drive signal for said semiconductor switch, said drive circuit having a supply terminal;
    wherein said first and second terminal zones of said semiconductor component are connected between said primary coil and said supply terminal of said drive circuit.

12. A method of producing a semiconductor component, which comprises the following method steps:
    providing an assembly having a semiconductor body, formed with a drift zone of a first conductivity type and a channel zone of a second conductivity type disposed in the drift zone at a front side of the semiconductor body, the assembly further having a control electrode insulated from the semiconductor body and disposed above the front side of the semiconductor body;
    producing of a cutout in the control electrode, above the channel zone, and extending to above the drift zone in the lateral direction;
    doping the channel zone below edges of the control electrode in a region of the cutout with dopants of the first conductivity type, to form a channel of the first conductivity type;
    producing a first terminal zone of the first conductivity type in the channel zone, the terminal zone adjoining the channel of the first conductivity type in the component, to thereby produce a semiconductor component having:
    at least one first terminal zone of a first conductivity type formed in a semiconductor body, and a first terminal electrode contact-connected to said first terminal zone;
    a drift zone of the first conductivity type, and a second terminal zone of a second conductivity type adjoining said drift zone;
    a channel zone of the second conductivity type disposed between said at least one first terminal zone and said drift zone, and a control electrode insulated from said semiconductor body and adjacent said channel zone;
    said channel zone having a first channel in a region adjacent said control electrode, and said first channel conducting only upon application of a non-zero control voltage between said control electrode and said first terminal zone; and at least one second channel of the first conductivity type connecting said first terminal electrode to said drift zone, said at least one second channel already conducting when the control voltage equals zero.

13. The method according to claim 12, which comprises producing the first terminal zone after producing the channel.

14. The method according to claim 12, which comprises producing the first terminal zone before producing the channel, and forming the cutout in the control electrode to extend to above the first terminal zone in the lateral direction.

15. The method according to claim 12, wherein the step of doping the channel zone below the edges of the control electrode to produce the channel comprises the following method steps:

implanting dopants of the first conductivity type into the channel zone at a bottom of the cutout;

carrying out a diffusion step to drive the implanted charge carriers under the edges of the control electrode in the channel zone;

removing the implanted dopant atoms in the channel zone at the bottom of the cutout such that dopant atoms remain under edges of the control electrode in the channel zone; and filling the cutout with an insulating filling material.

16. The method according to claim 15, wherein removing the implanted dopant atoms in the channel zone at the bottom of the cutout comprises removing an upper layer of the channel zone using the control electrode as a mask.

17. The method according to claim 12, wherein the step of doping the channel zone below the edges of the control electrode to produce the conducting channel comprises the following method steps:

implanting charge carriers of the first conductivity type into the channel zone at a bottom of the cutout at an implantation angle of greater than 0°;

removing the implanted dopant atoms in the channel zone at the bottom of the cutout such that dopant atoms remain under edges of the control electrode in the channel zone; and filling the cutout with an insulating filling material.

18. The method according to claim 17, wherein removing the implanted dopant atoms in the channel zone at the bottom of the cutout comprises removing an upper layer of the channel zone using the control electrode as a mask.

* * * * *